(12) United States Patent
Wang et al.

(10) Patent No.: US 10,867,309 B1
(45) Date of Patent: Dec. 15, 2020

(54) SYSTEMS AND METHODS FOR OUTBOUND FORECASTING BASED ON A FULFILLMENT CENTER PRIORITY VALUE

(71) Applicant: Coupang, Corp., Seoul (KR)

(72) Inventors: Nan Wang, Shanghai (CN); Ke Ma, Shanghai (CN); Christopher Carlson, Seoul (KR); Bin Gu, Shanghai (CN); Shixian Li, Shanghai (CN)

(73) Assignee: Coupang Corp., Seoul (KR)

( * ) Notice: Subject to any disclaimer, the term of this patent is extended or adjusted under 35 U.S.C. 154(b) by 0 days.

(21) Appl. No.: 16/576,339

(22) Filed: Sep. 19, 2019

(51) Int. Cl.
| | | |
|---|---|---|
| *G06Q 30/02* | (2012.01) |
| *G06Q 10/08* | (2012.01) |
| *G06F 30/20* | (2020.01) |
| *G06F 12/0802* | (2016.01) |
| *G06F 17/16* | (2006.01) |
| *G06N 7/00* | (2006.01) |

(52) U.S. Cl.
CPC ......... *G06Q 30/0202* (2013.01); *G06F 30/20* (2020.01); *G06N 7/00* (2013.01); *G06Q 10/087* (2013.01); *G06F 12/0802* (2013.01); *G06F 17/16* (2013.01)

(58) Field of Classification Search
CPC .. G06Q 30/0202; G06Q 10/087; G06F 30/20; G06N 7/00
USPC ...................................................... 705/7.31
See application file for complete search history.

(56) References Cited

U.S. PATENT DOCUMENTS

| | | | | |
|---|---|---|---|---|
| 8,099,320 B2 * | 1/2012 | Li | ........................ | G06Q 10/04 705/7.29 |
| 8,249,917 B1 * | 8/2012 | Kassmann | ......... | G06Q 30/0601 705/12 |
| 8,374,922 B1 * | 2/2013 | Antony | .................. | G06Q 30/00 705/26.1 |
| 8,438,052 B1 * | 5/2013 | Chanda | .............. | G06Q 30/0282 705/7.11 |
| 8,527,373 B1 * | 9/2013 | Ricci | .................... | G06Q 10/087 705/22 |
| 8,620,707 B1 * | 12/2013 | Belyi | ................... | G06Q 10/087 705/28 |
| 10,546,269 B1 * | 1/2020 | Gaurav | ................ | G06Q 10/087 |
| 2002/0133387 A1 * | 9/2002 | Wilson | ............... | G06Q 10/0631 705/338 |
| 2003/0093388 A1 * | 5/2003 | Albright | ................ | G06Q 10/08 705/400 |

(Continued)

*Primary Examiner* — Dylan C White
(74) *Attorney, Agent, or Firm* — Finnegan, Henderson, Farabow, Garrett & Dunner LLP

(57) ABSTRACT

The embodiments of the present disclosure provide systems and methods for outbound forecasting, comprising receiving an initial distribution of priority values to each fulfillment center (FC) in each region, running a simulation, using a simulation algorithm, of the initial distribution, calculating an outbound capacity utilization value of each FC, determining a number of FCs comprising an outbound capacity utilization value that exceeds a predetermined threshold, feeding the simulation algorithm with the determined number of FCs to generate one or more additional distributions of priority values, generating a FC priority filter comprising an optimal set of priority values based on the one or more additional distributions of priority values, and modifying an allocation of a plurality of SKUs among a plurality of FCs based on the generated FC priority filter.

14 Claims, 10 Drawing Sheets

(56) References Cited

U.S. PATENT DOCUMENTS

| | | | |
|---|---|---|---|
| 2006/0136237 A1* | 6/2006 | Spiegel | G06Q 10/08 |
| | | | 705/330 |
| 2009/0240544 A1* | 9/2009 | Cheng | G06Q 10/06 |
| | | | 705/7.12 |
| 2011/0295413 A1* | 12/2011 | Hara | G06Q 10/087 |
| | | | 700/216 |
| 2012/0284083 A1* | 11/2012 | Wu | G06Q 10/08 |
| | | | 705/7.31 |
| 2014/0278627 A1* | 9/2014 | Grabovski | G06Q 10/06311 |
| | | | 705/7.13 |
| 2019/0323250 A1* | 10/2019 | Elsawi | B01D 37/00 |

* cited by examiner

400

| | | $FC_1$ | $FC_2$ | $FC_3$ | ... | $FC_x$ |
|---|---|---|---|---|---|---|
| M = | $R_1$ | $P_{11}$ | $P_{21}$ | $P_{31}$ | ... | $P_{x1}$ |
| | $R_2$ | $P_{12}$ | $P_{22}$ | $P_{32}$ | ... | $P_{x2}$ |
| | $R_3$ | $P_{13}$ | $P_{23}$ | $P_{33}$ | ... | $P_{x3}$ |
| | ... | ... | ... | ... | ... | ... |
| | $R_r$ | $P_{1r}$ | $P_{2r}$ | $P_{3r}$ | ... | $P_{xr}$ |

FIG. 4

SYSTEMS AND METHODS FOR OUTBOUND FORECASTING BASED ON A FULFILLMENT CENTER PRIORITY VALUE

TECHNICAL FIELD

The present disclosure generally relates to computerized systems and methods for outbound forecasting. In particular, embodiments of the present disclosure relate to inventive and unconventional systems related to outbound forecasting based on a fulfillment center (FC) priority filter generated by a simulation algorithm.

BACKGROUND

Typically, when customer orders are made, the orders must be transferred to one or more fulfillment centers. However, customer orders, especially online customer orders, are made by many different customers located at many different regions, and as such, the orders are bound for many different destinations. Therefore, the orders must be properly sorted such that they are routed to an appropriate fulfillment center and, ultimately, correctly routed to their destination.

Systems and methods for optimizing shipping practices and identifying shipping routes for outbound products already exist. For example, conventional methods simulate shipments according to shipping routes. In order to determine the optimal routing plan, an alternative routing module can modify package routing data according to a user input. That is, the user may manually change data associated with the original package routing data and view the effects of each routing change. This process is repeated until the optimal routing plan is determined.

However, these conventional systems and methods for outbound forecasting of products is difficult, time-consuming, and inaccurate mainly because they require manual modification and repeated testing of individual combinations of parameters. Especially for entities with multiple fulfillment centers throughout the region, it is significantly challenging and time-consuming to replicate outbound flow of products at all levels of processes, including the level at which customer orders are initially received, the level at which inbound/stowing/inventory estimates are determined, and the level at which logic to assign orders to various fulfillment centers is determined. In addition, because conventional systems and methods require manual modification and repeated testing after each modification, simulation can only be done on a larger scale, rather than on a granular scale. For example, simulation can only be done on a product type by product type basis, rather than on a stocking keeping unit (SKU) by SKU basis.

In addition, conventional systems and methods for forecasting outbound flow of products do not allow for a "what if" analysis. That is, conventional systems and methods do not take into consideration certain events, such as an unexpected increase in customer demand for a particular product, that could arise and significantly affect future outbound flow of products.

Therefore, there is a need for improved systems and methods for outbound forecasting of products. In particular, there is a need for improved systems and methods for outbound forecasting based on a fulfillment center (FC) priority filter generated to optimize outbound capacity utilization of FCs in a network. In addition, there is a need for improved systems and methods for outbound forecasting based on simulations that take into consideration one or more parameters associated with past customer orders and currently pending customer orders.

SUMMARY

One aspect of the present disclosure is directed to a computer-implemented system for optimizing allocation of products. The system may comprise a memory storing instructions and at least one processor configured to execute the instructions. The at least one processor may be configured to execute the instructions to receive an initial distribution of priority values to each fulfillment center (FC) in each region, run a simulation, using a simulation algorithm, of the initial distribution, calculate an outbound capacity utilization value of each FC, determine a number of FCs comprising an outbound capacity utilization value that exceeds a predetermined threshold, feed the simulation algorithm with at least one of the determined number of FCs to generate one or more additional distributions of priority values, generate a FC priority filter comprising an optimal set of priority values based on the one or more additional distributions of priority values, and modify an allocation of a plurality of SKUs among a plurality of FCs based on the generated FC priority filter.

In some embodiments, the predetermined threshold may comprise a minimum outbound of each FC. In some embodiments, the outbound capacity utilization value of each FC may comprise a ratio of an outbound of each FC to an outbound capacity of each FC. In some embodiments, each of the initial distribution and the one or more additional distributions may comprise a two-dimensional matrix of priority values. In some embodiments, the initial distribution of priority values to each FC in each region may be randomly generated.

In some embodiments, the at least one processor may be further configured to execute the instructions to cache at least a portion of the simulation algorithm. The cached portion of the simulation algorithm may comprise at least one constraint that remains substantially constant with each run of the simulation algorithm. In some embodiments, the at least one processor may be further configured to execute the instructions to simulate customer demand at each of the plurality of FCs and modify the allocation of the plurality of SKUs among the plurality of FCs based on the simulated customer demand. In some embodiments, the simulation algorithm may comprise at least one constraint, and the constraint may comprise at least one of customer demand at each of the FCs, maximum capacities of the FCs, compatibility with FCs, or transfer costs between FCs. In some embodiments, each of the plurality of SKUs may be indicative of at least one of a manufacturer, material, size, color, packaging, type, or weight of a product.

Another aspect of the present disclosure is directed to a computer-implemented method for optimizing allocation of products. The method may comprise receiving an initial distribution of priority values to each fulfillment center (FC) in each region, running a simulation, using a simulation algorithm, of the initial distribution, calculating an outbound capacity utilization value of each FC, determining a number of FCs comprising an outbound capacity utilization value that exceeds a predetermined threshold, feeding the simulation algorithm with the determined number of FCs to generate one or more additional distributions of priority values, generating a FC priority filter comprising an optimal set of priority values based on the one or more additional distributions of priority values, and modifying an allocation of a plurality of SKUs among a plurality of FCs based on the generated FC priority filter.

In some embodiments, the predetermined threshold may comprise a minimum outbound of each FC. In some embodiments, the outbound capacity utilization value of each FC may comprise a ratio of an outbound of each FC to an outbound capacity of each FC. In some embodiments, each of the initial distribution and the one or more additional distributions may comprise a two-dimensional matrix of priority values. In some embodiments, the initial distribution of priority values to each FC in each region may be randomly generated.

In some embodiments, the method may further comprise caching at least a portion of the simulation algorithm. The cached portion of the simulation algorithm may comprise at least one constraint that remains substantially constant with each run of the simulation algorithm. In some embodiments, the method may further comprise simulating customer demand at each of the plurality of FCs and modifying the allocation of the plurality of SKUs among the plurality of FCs based on the simulated customer demand. In some embodiments, the simulation algorithm may comprise at least one constraint, and the constraint may comprise at least one of customer demand at each of the FCs, maximum capacities of the FCs, compatibility with FCs, or transfer costs between FCs.

Yet another aspect of the present disclosure is directed to a computer-implemented system for optimizing allocation of products. The system may comprise a memory storing instructions and at least one processor configured to execute the instructions. The at least one processor may be configured to execute the instructions to receive an initial matrix of priority values to each fulfillment center (FC) in each region, run a simulation, using a simulation algorithm, of the initial matrix, calculate an outbound capacity utilization value of each FC, determine a number of FCs comprising an outbound capacity utilization value that exceeds a predetermined threshold, feed the simulation algorithm with at least one of the determined number of FCs to generate one or more additional matrices of priority values, generate a FC priority filter comprising an optimal set of priority values based on the one or more additional matrices of priority values, and modify an allocation of a plurality of SKUs among a plurality of FCs based on the generated FC priority filter. The outbound capacity utilization value of each FC may comprise a ratio of an outbound of each FC to an outbound capacity of each FC.

Other systems, methods, and computer-readable media are also discussed herein.

BRIEF DESCRIPTION OF THE DRAWINGS

FIG. 4 is an exemplary matrix of a distribution of priority values to each fulfillment center (FC), consistent with the disclosed embodiments.

DETAILED DESCRIPTION

Figure 1A:
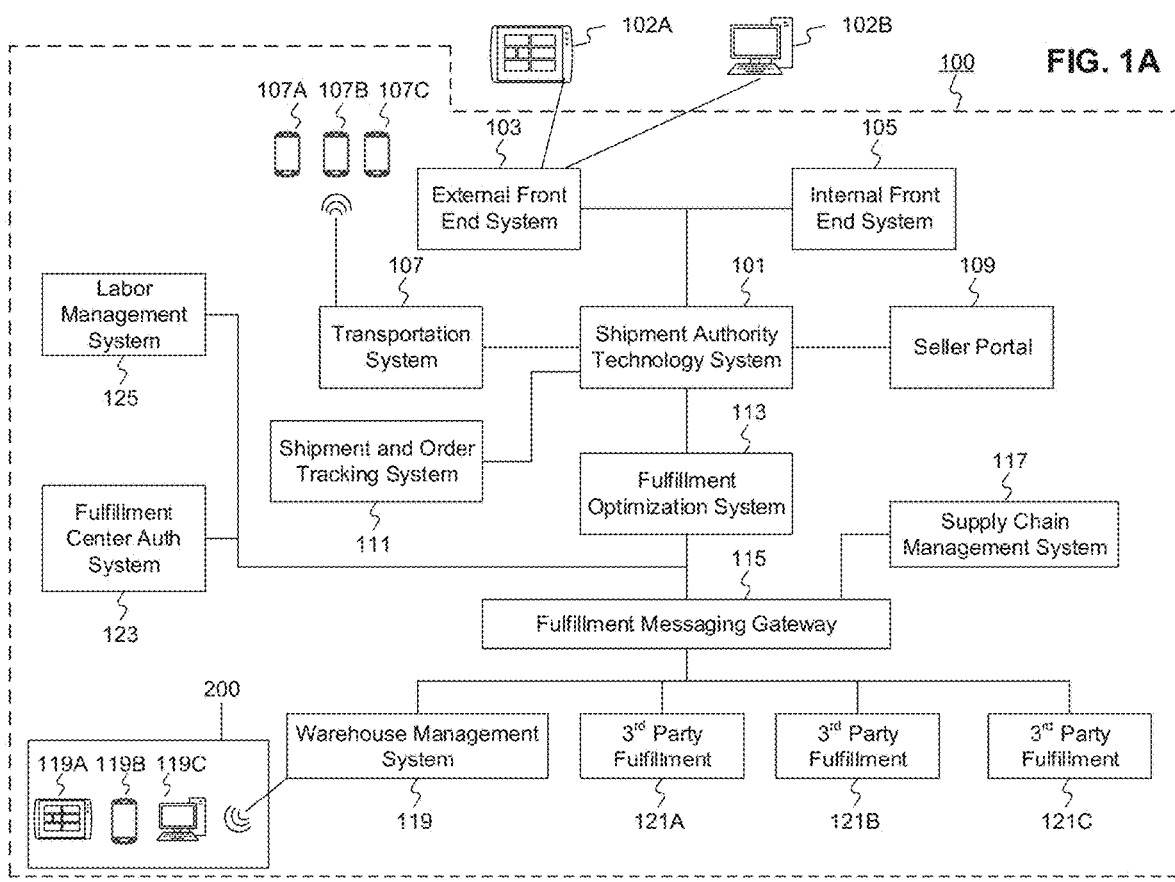
FIG. 1A is a schematic block diagram illustrating an exemplary embodiment of a network comprising computerized systems for communications enabling shipping, transportation, and logistics operations, consistent with the disclosed embodiments.
Figure 1B:
FIG. 1B depicts a sample Search Result Page (SRP) that includes one or more search results satisfying a search request along with interactive user interface elements, consistent with the disclosed embodiments.
Figure 1C:
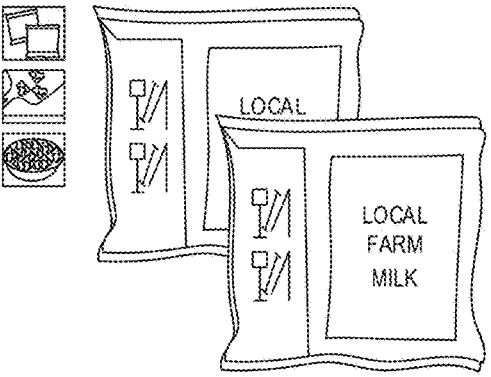
FIG. 1C depicts a sample Single Display Page (SDP) that includes a product and information about the product along with interactive user interface elements, consistent with the disclosed embodiments.

The following detailed description refers to the accompanying drawings. Wherever possible, the same reference numbers are used in the drawings and the following description to refer to the same or similar parts. While several illustrative embodiments are described herein, modifications, adaptations and other implementations are possible. For example, substitutions, additions, or modifications may be made to the components and steps illustrated in the drawings, and the illustrative methods described herein may be modified by substituting, reordering, removing, or adding steps to the disclosed methods. Accordingly, the following detailed description is not limited to the disclosed embodiments and examples. Instead, the proper scope of the invention is defined by the appended claims.

Embodiments of the present disclosure are directed to systems and methods configured for outbound forecasting based on a fulfillment center (FC) priority filter generated by a simulation algorithm.

Referring to FIG. 1A, a schematic block diagram 100 illustrating an exemplary embodiment of a system comprising computerized systems for communications enabling shipping, transportation, and logistics operations is shown. As illustrated in FIG. 1A, system 100 may include a variety of systems, each of which may be connected to one another via one or more networks. The systems may also be connected to one another via a direct connection, for example, using a cable. The depicted systems include a shipment authority technology (SAT) system 101, an external front end system 103, an internal front end system 105, a transportation system 107, mobile devices 107A, 107B, and 107C, seller portal 109, shipment and order tracking (SOT) system 111, fulfillment optimization (FO) system 113, fulfillment messaging gateway (FMG) 115, supply chain management (SCM) system 117, warehouse management system 119, mobile devices 119A, 119B, and 119C (depicted as being inside of fulfillment center (FC) 200), 3$^{rd}$ party fulfillment systems 121A, 121B, and 121C, fulfillment center authorization system (FC Auth) 123, and labor management system (LMS) 125.

SAT system 101, in some embodiments, may be implemented as a computer system that monitors order status and delivery status. For example, SAT system 101 may determine whether an order is past its Promised Delivery Date (PDD) and may take appropriate action, including initiating a new order, reshipping the items in the non-delivered order, canceling the non-delivered order, initiating contact with the ordering customer, or the like. SAT system 101 may also monitor other data, including output (such as a number of packages shipped during a particular time period) and input (such as the number of empty cardboard boxes received for use in shipping). SAT system 101 may also act as a gateway between different devices in system 100, enabling communication (e.g., using store-and-forward or other techniques) between devices such as external front end system 103 and FO system 113.

External front end system 103, in some embodiments, may be implemented as a computer system that enables external users to interact with one or more systems in system 100. For example, in embodiments where system 100 enables the presentation of systems to enable users to place an order for an item, external front end system 103 may be implemented as a web server that receives search requests, presents item pages, and solicits payment information. For example, external front end system 103 may be implemented as a computer or computers running software such as the Apache HTTP Server, Microsoft Internet Information Services (IIS), NGINX, or the like. In other embodiments, external front end system 103 may run custom web server software designed to receive and process requests from external devices (e.g., mobile device 102A or computer 102B), acquire information from databases and other data stores based on those requests, and provide responses to the received requests based on acquired information.

In some embodiments, external front end system 103 may include one or more of a web caching system, a database, a search system, or a payment system. In one aspect, external front end system 103 may comprise one or more of these systems, while in another aspect, external front end system 103 may comprise interfaces (e.g., server-to-server, database-to-database, or other network connections) connected to one or more of these systems.

An illustrative set of steps, illustrated by FIGS. 1B, 1C, 1D, and 1E, will help to describe some operations of external front end system 103. External front end system 103 may receive information from systems or devices in system 100 for presentation and/or display. For example, external front end system 103 may host or provide one or more web pages, including a Search Result Page (SRP) (e.g., FIG. 1B), a Single Detail Page (SDP) (e.g., FIG. 1C), a Cart page (e.g., FIG. 1D), or an Order page (e.g., FIG. 1E). A user device (e.g., using mobile device 102A or computer 102B) may navigate to external front end system 103 and request a search by entering information into a search box. External front end system 103 may request information from one or more systems in system 100. For example, external front end system 103 may request information from FO System 113 that satisfies the search request. External front end system 103 may also request and receive (from FO System 113) a Promised Delivery Date or "PDD" for each product included in the search results. The PDD, in some embodiments, may represent an estimate of when a package containing the product will arrive at the user's desired location or a date by which the product is promised to be delivered at the user's desired location if ordered within a particular period of time, for example, by the end of the day (11:59 PM). (PDD is discussed further below with respect to FO System 113.)

External front end system 103 may prepare an SRP (e.g., FIG. 1B) based on the information. The SRP may include information that satisfies the search request. For example, this may include pictures of products that satisfy the search request. The SRP may also include respective prices for each product, or information relating to enhanced delivery options for each product, PDD, weight, size, offers, discounts, or the like. External front end system 103 may send the SRP to the requesting user device (e.g., via a network).

A user device may then select a product from the SRP, e.g., by clicking or tapping a user interface, or using another input device, to select a product represented on the SRP. The user device may formulate a request for information on the selected product and send it to external front end system 103. In response, external front end system 103 may request information related to the selected product. For example, the information may include additional information beyond that presented for a product on the respective SRP. This could include, for example, shelf life, country of origin, weight, size, number of items in package, handling instructions, or other information about the product. The information could also include recommendations for similar products (based on, for example, big data and/or machine learning analysis of customers who bought this product and at least one other product), answers to frequently asked questions, reviews from customers, manufacturer information, pictures, or the like.

External front end system 103 may prepare an SDP (Single Detail Page) (e.g., FIG. 1C) based on the received product information. The SDP may also include other interactive elements such as a "Buy Now" button, a "Add to Cart" button, a quantity field, a picture of the item, or the like. The SDP may further include a list of sellers that offer the product. The list may be ordered based on the price each seller offers such that the seller that offers to sell the product at the lowest price may be listed at the top. The list may also be ordered based on the seller ranking such that the highest ranked seller may be listed at the top. The seller ranking may be formulated based on multiple factors, including, for example, the seller's past track record of meeting a promised PDD. External front end system 103 may deliver the SDP to the requesting user device (e.g., via a network).

The requesting user device may receive the SDP which lists the product information. Upon receiving the SDP, the user device may then interact with the SDP. For example, a user of the requesting user device may click or otherwise interact with a "Place in Cart" button on the SDP. This adds the product to a shopping cart associated with the user. The user device may transmit this request to add the product to the shopping cart to external front end system 103.

Figure 1D:
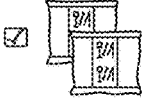
FIG. 1D depicts a sample Cart page that includes items in a virtual shopping cart along with interactive user interface elements, consistent with the disclosed embodiments.
Figure 1E:
FIG. 1E depicts a sample Order page that includes items from the virtual shopping cart along with information regarding purchase and shipping, along with interactive user interface elements, consistent with the disclosed embodiments.

External front end system 103 may generate a Cart page (e.g., FIG. 1D). The Cart page, in some embodiments, lists the products that the user has added to a virtual "shopping cart." A user device may request the Cart page by clicking on or otherwise interacting with an icon on the SRP, SDP, or other pages. The Cart page may, in some embodiments, list all products that the user has added to the shopping cart, as well as information about the products in the cart such as a quantity of each product, a price for each product per item, a price for each product based on an associated quantity, information regarding PDD, a delivery method, a shipping cost, user interface elements for modifying the products in the shopping cart (e.g., deletion or modification of a quantity), options for ordering other product or setting up periodic delivery of products, options for setting up interest payments, user interface elements for proceeding to purchase, or the like. A user at a user device may click on or otherwise interact with a user interface element (e.g., a button that reads "Buy Now") to initiate the purchase of the product in the shopping cart. Upon doing so, the user device may transmit this request to initiate the purchase to external front end system 103.

External front end system 103 may generate an Order page (e.g., FIG. 1E) in response to receiving the request to initiate a purchase. The Order page, in some embodiments, re-lists the items from the shopping cart and requests input of payment and shipping information. For example, the Order page may include a section requesting information about the purchaser of the items in the shopping cart (e.g., name, address, e-mail address, phone number), information about the recipient (e.g., name, address, phone number, delivery information), shipping information (e.g., speed/method of delivery and/or pickup), payment information (e.g., credit card, bank transfer, check, stored credit), user interface elements to request a cash receipt (e.g., for tax purposes), or the like. External front end system 103 may send the Order page to the user device.

The user device may enter information on the Order page and click or otherwise interact with a user interface element that sends the information to external front end system 103. From there, external front end system 103 may send the information to different systems in system 100 to enable the creation and processing of a new order with the products in the shopping cart.

In some embodiments, external front end system 103 may be further configured to enable sellers to transmit and receive information relating to orders.

Internal front end system 105, in some embodiments, may be implemented as a computer system that enables internal users (e.g., employees of an organization that owns, operates, or leases system 100) to interact with one or more systems in system 100. For example, in embodiments where network 101 enables the presentation of systems to enable users to place an order for an item, internal front end system 105 may be implemented as a web server that enables internal users to view diagnostic and statistical information about orders, modify item information, or review statistics relating to orders. For example, internal front end system 105 may be implemented as a computer or computers running software such as the Apache HTTP Server, Microsoft Internet Information Services (IIS), NGINX, or the like. In other embodiments, internal front end system 105 may run custom web server software designed to receive and process requests from systems or devices depicted in system 100 (as well as other devices not depicted), acquire information from databases and other data stores based on those requests, and provide responses to the received requests based on acquired information.

In some embodiments, internal front end system 105 may include one or more of a web caching system, a database, a search system, a payment system, an analytics system, an order monitoring system, or the like. In one aspect, internal front end system 105 may comprise one or more of these systems, while in another aspect, internal front end system 105 may comprise interfaces (e.g., server-to-server, database-to-database, or other network connections) connected to one or more of these systems.

Transportation system 107, in some embodiments, may be implemented as a computer system that enables communication between systems or devices in system 100 and mobile devices 107A-107C. Transportation system 107, in some embodiments, may receive information from one or more mobile devices 107A-107C (e.g., mobile phones, smart phones, PDAs, or the like). For example, in some embodiments, mobile devices 107A-107C may comprise devices operated by delivery workers. The delivery workers, who may be permanent, temporary, or shift employees, may utilize mobile devices 107A-107C to effect delivery of packages containing the products ordered by users. For example, to deliver a package, the delivery worker may receive a notification on a mobile device indicating which package to deliver and where to deliver it. Upon arriving at the delivery location, the delivery worker may locate the package (e.g., in the back of a truck or in a crate of packages), scan or otherwise capture data associated with an identifier on the package (e.g., a barcode, an image, a text string, an RFID tag, or the like) using the mobile device, and deliver the package (e.g., by leaving it at a front door, leaving it with a security guard, handing it to the recipient, or the like). In some embodiments, the delivery worker may capture photo(s) of the package and/or may obtain a signature using the mobile device. The mobile device may send information to transportation system 107 including information about the delivery, including, for example, time, date, GPS location, photo(s), an identifier associated with the delivery worker, an identifier associated with the mobile device, or the like. Transportation system 107 may store this information in a database (not pictured) for access by other systems in system 100. Transportation system 107 may, in some embodiments, use this information to prepare and send tracking data to other systems indicating the location of a particular package.

In some embodiments, certain users may use one kind of mobile device (e.g., permanent workers may use a specialized PDA with custom hardware such as a barcode scanner, stylus, and other devices) while other users may use other kinds of mobile devices (e.g., temporary or shift workers may utilize off-the-shelf mobile phones and/or smartphones).

In some embodiments, transportation system 107 may associate a user with each device. For example, transportation system 107 may store an association between a user (represented by, e.g., a user identifier, an employee identifier, or a phone number) and a mobile device (represented by, e.g., an International Mobile Equipment Identity (IMEI), an International Mobile Subscription Identifier (IMSI), a phone number, a Universal Unique Identifier (UUID), or a Globally Unique Identifier (GUID)). Transportation system 107 may use this association in conjunction with data received on deliveries to analyze data stored in the database in order to determine, among other things, a location of the worker, an efficiency of the worker, or a speed of the worker.

Seller portal 109, in some embodiments, may be implemented as a computer system that enables sellers or other external entities to electronically communicate with one or more systems in system 100. For example, a seller may utilize a computer system (not pictured) to upload or provide product information, order information, contact information, or the like, for products that the seller wishes to sell through system 100 using seller portal 109.

Shipment and order tracking system 111, in some embodiments, may be implemented as a computer system that receives, stores, and forwards information regarding the location of packages containing products ordered by customers (e.g., by a user using devices 102A-102B). In some embodiments, shipment and order tracking system 111 may request or store information from web servers (not pictured) operated by shipping companies that deliver packages containing products ordered by customers.

In some embodiments, shipment and order tracking system 111 may request and store information from systems depicted in system 100. For example, shipment and order tracking system 111 may request information from transportation system 107. As discussed above, transportation system 107 may receive information from one or more mobile devices 107A-107C (e.g., mobile phones, smart phones, PDAs, or the like) that are associated with one or more of a user (e.g., a delivery worker) or a vehicle (e.g., a delivery truck). In some embodiments, shipment and order tracking system 111 may also request information from warehouse management system (WMS) 119 to determine the location of individual products inside of a fulfillment center (e.g., fulfillment center 200). Shipment and order tracking system 111 may request data from one or more of transportation system 107 or WMS 119, process it, and present it to a device (e.g., user devices 102A and 102B) upon request.

Fulfillment optimization (FO) system 113, in some embodiments, may be implemented as a computer system that stores information for customer orders from other systems (e.g., external front end system 103 and/or shipment and order tracking system 111). FO system 113 may also store information describing where particular items are held or stored. For example, certain items may be stored only in one fulfillment center, while certain other items may be stored in multiple fulfillment centers. In still other embodiments, certain fulfilment centers may be designed to store only a particular set of items (e.g., fresh produce or frozen products). FO system 113 stores this information as well as associated information (e.g., quantity, size, date of receipt, expiration date, etc.).

FO system 113 may also calculate a corresponding PDD (promised delivery date) for each product. The PDD, in some embodiments, may be based on one or more factors. For example, FO system 113 may calculate a PDD for a product based on a past demand for a product (e.g., how many times that product was ordered during a period of time), an expected demand for a product (e.g., how many customers are forecast to order the product during an upcoming period of time), a network-wide past demand indicating how many products were ordered during a period of time, a network-wide expected demand indicating how many products are expected to be ordered during an upcoming period of time, one or more counts of the product stored in each fulfillment center 200, which fulfillment center stores each product, expected or current orders for that product, or the like.

In some embodiments, FO system 113 may determine a PDD for each product on a periodic basis (e.g., hourly) and store it in a database for retrieval or sending to other systems (e.g., external front end system 103, SAT system 101, shipment and order tracking system 111). In other embodiments, FO system 113 may receive electronic requests from one or more systems (e.g., external front end system 103, SAT system 101, shipment and order tracking system 111) and calculate the PDD on demand.

Fulfilment messaging gateway (FMG) 115, in some embodiments, may be implemented as a computer system that receives a request or response in one format or protocol from one or more systems in system 100, such as FO system 113, converts it to another format or protocol, and forward it in the converted format or protocol to other systems, such as WMS 119 or $3^{rd}$ party fulfillment systems 121A, 121B, or 121C, and vice versa.

Supply chain management (SCM) system 117, in some embodiments, may be implemented as a computer system that performs forecasting functions. For example, SCM system 117 may forecast a level of demand for a particular product based on, for example, based on a past demand for products, an expected demand for a product, a network-wide past demand, a network-wide expected demand, a count products stored in each fulfillment center 200, expected or current orders for each product, or the like. In response to this forecasted level and the amount of each product across all fulfillment centers, SCM system 117 may generate one or more purchase orders to purchase and stock a sufficient quantity to satisfy the forecasted demand for a particular product.

Warehouse management system (WMS) 119, in some embodiments, may be implemented as a computer system that monitors workflow. For example, WMS 119 may receive event data from individual devices (e.g., devices 107A-107C or 119A-119C) indicating discrete events. For example, WMS 119 may receive event data indicating the use of one of these devices to scan a package. As discussed below with respect to fulfillment center 200 and FIG. 2, during the fulfillment process, a package identifier (e.g., a barcode or RFID tag data) may be scanned or read by machines at particular stages (e.g., automated or handheld barcode scanners, RFID readers, high-speed cameras, devices such as tablet 119A, mobile device/PDA 119B, computer 119C, or the like). WMS 119 may store each event indicating a scan or a read of a package identifier in a corresponding database (not pictured) along with the package identifier, a time, date, location, user identifier, or other information, and may provide this information to other systems (e.g., shipment and order tracking system 111).

WMS 119, in some embodiments, may store information associating one or more devices (e.g., devices 107A-107C or 119A-119C) with one or more users associated with system 100. For example, in some situations, a user (such as a part- or full-time employee) may be associated with a mobile device in that the user owns the mobile device (e.g., the mobile device is a smartphone). In other situations, a user may be associated with a mobile device in that the user is temporarily in custody of the mobile device (e.g., the user checked the mobile device out at the start of the day, will use it during the day, and will return it at the end of the day).

WMS 119, in some embodiments, may maintain a work log for each user associated with system 100. For example, WMS 119 may store information associated with each employee, including any assigned processes (e.g., unloading trucks, picking items from a pick zone, rebin wall work, packing items), a user identifier, a location (e.g., a floor or zone in a fulfillment center 200), a number of units moved through the system by the employee (e.g., number of items picked, number of items packed), an identifier associated with a device (e.g., devices 119A-119C), or the like. In some embodiments, WMS 119 may receive check-in and check-out information from a timekeeping system, such as a timekeeping system operated on a device 119A-119C.

$3^{rd}$ party fulfillment (3PL) systems 121A-121C, in some embodiments, represent computer systems associated with third-party providers of logistics and products. For example, while some products are stored in fulfillment center 200 (as discussed below with respect to FIG. 2), other products may be stored off-site, may be produced on demand, or may be otherwise unavailable for storage in fulfillment center 200. 3PL systems 121A-121C may be configured to receive orders from FO system 113 (e.g., through FMG 115) and may provide products and/or services (e.g., delivery or installation) to customers directly. In some embodiments, one or more of 3PL systems 121A-121C may be part of system 100, while in other embodiments, one or more of 3PL systems 121A-121C may be outside of system 100 (e.g., owned or operated by a third-party provider).

Fulfillment Center Auth system (FC Auth) 123, in some embodiments, may be implemented as a computer system with a variety of functions. For example, in some embodiments, FC Auth 123 may act as a single-sign on (SSO) service for one or more systems in system 100. For example, FC Auth 123 may enable a user to log in via internal front end system 105, determine that the user has similar privileges to access resources at shipment and order tracking system 111, and enable the user to access those privileges without requiring a second log in process. FC Auth 123, in other embodiments, may enable users (e.g., employees) to associate themselves with a particular task. For example, some employees may not have an electronic device (such as devices 119A-119C) and may instead move from task to task, and zone to zone, within a fulfillment center 200, during the course of a day. FC Auth 123 may be configured to enable those employees to indicate what task they are performing and what zone they are in at different times of day.

Labor management system (LMS) 125, in some embodiments, may be implemented as a computer system that stores attendance and overtime information for employees (including full-time and part-time employees). For example, LMS 125 may receive information from FC Auth 123, WMA 119, devices 119A-119C, transportation system 107, and/or devices 107A-107C.

The particular configuration depicted in FIG. 1A is an example only. For example, while FIG. 1A depicts FC Auth system 123 connected to FO system 113, not all embodiments require this particular configuration. Indeed, in some embodiments, the systems in system 100 may be connected to one another through one or more public or private networks, including the Internet, an Intranet, a WAN (Wide-Area Network), a MAN (Metropolitan-Area Network), a wireless network compliant with the IEEE 802.11a/b/g/n Standards, a leased line, or the like. In some embodiments, one or more of the systems in system 100 may be implemented as one or more virtual servers implemented at a data center, server farm, or the like.

Figure 2:
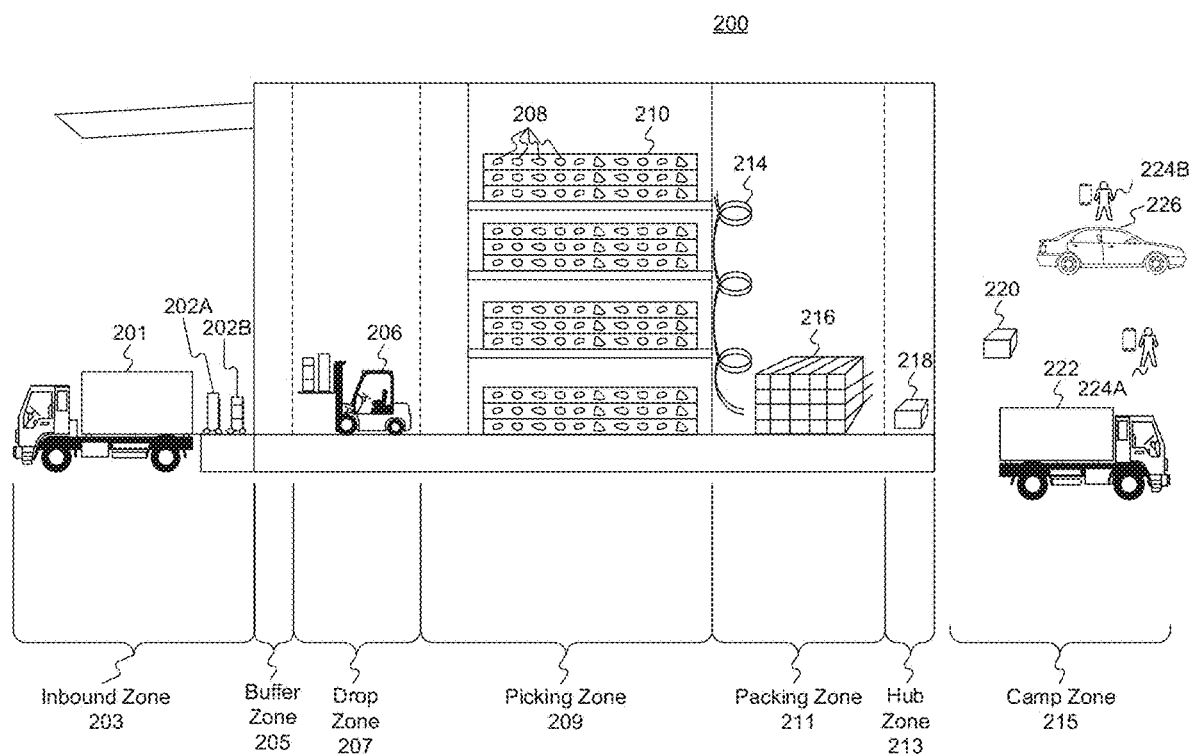
FIG. 2 is a diagrammatic illustration of an exemplary fulfillment center configured to utilize disclosed computerized systems, consistent with the disclosed embodiments.

FIG. 2 depicts a fulfillment center 200. Fulfillment center 200 is an example of a physical location that stores items for shipping to customers when ordered. Fulfillment center (FC) 200 may be divided into multiple zones, each of which are depicted in FIG. 2. These "zones," in some embodiments, may be thought of as virtual divisions between different stages of a process of receiving items, storing the items, retrieving the items, and shipping the items. So while the "zones" are depicted in FIG. 2, other divisions of zones are possible, and the zones in FIG. 2 may be omitted, duplicated, or modified in some embodiments.

Inbound zone 203 represents an area of FC 200 where items are received from sellers who wish to sell products using system 100 from FIG. 1A. For example, a seller may deliver items 202A and 202B using truck 201. Item 202A may represent a single item large enough to occupy its own shipping pallet, while item 202B may represent a set of items that are stacked together on the same pallet to save space.

A worker will receive the items in inbound zone 203 and may optionally check the items for damage and correctness using a computer system (not pictured). For example, the worker may use a computer system to compare the quantity of items 202A and 202B to an ordered quantity of items. If the quantity does not match, that worker may refuse one or more of items 202A or 202B. If the quantity does match, the worker may move those items (using, e.g., a dolly, a handtruck, a forklift, or manually) to buffer zone 205. Buffer zone 205 may be a temporary storage area for items that are not currently needed in the picking zone, for example, because there is a high enough quantity of that item in the picking zone to satisfy forecasted demand. In some embodiments, forklifts 206 operate to move items around buffer zone 205 and between inbound zone 203 and drop zone 207. If there is a need for items 202A or 202B in the picking zone (e.g., because of forecasted demand), a forklift may move items 202A or 202B to drop zone 207.

Drop zone 207 may be an area of FC 200 that stores items before they are moved to picking zone 209. A worker assigned to the picking task (a "picker") may approach items 202A and 202B in the picking zone, scan a barcode for the picking zone, and scan barcodes associated with items 202A and 202B using a mobile device (e.g., device 119B). The picker may then take the item to picking zone 209 (e.g., by placing it on a cart or carrying it).

Picking zone 209 may be an area of FC 200 where items 208 are stored on storage units 210. In some embodiments, storage units 210 may comprise one or more of physical shelving, bookshelves, boxes, totes, refrigerators, freezers, cold stores, or the like. In some embodiments, picking zone 209 may be organized into multiple floors. In some embodiments, workers or machines may move items into picking zone 209 in multiple ways, including, for example, a forklift, an elevator, a conveyor belt, a cart, a handtruck, a dolly, an automated robot or device, or manually. For example, a picker may place items 202A and 202B on a handtruck or cart in drop zone 207 and walk items 202A and 202B to picking zone 209.

A picker may receive an instruction to place (or "stow") the items in particular spots in picking zone 209, such as a particular space on a storage unit 210. For example, a picker may scan item 202A using a mobile device (e.g., device 119B). The device may indicate where the picker should stow item 202A, for example, using a system that indicate an aisle, shelf, and location. The device may then prompt the picker to scan a barcode at that location before stowing item 202A in that location. The device may send (e.g., via a wireless network) data to a computer system such as WMS 119 in FIG. 1A indicating that item 202A has been stowed at the location by the user using device 119B.

Once a user places an order, a picker may receive an instruction on device 119B to retrieve one or more items 208 from storage unit 210. The picker may retrieve item 208, scan a barcode on item 208, and place it on transport mechanism 214. While transport mechanism 214 is represented as a slide, in some embodiments, transport mechanism may be implemented as one or more of a conveyor belt, an elevator, a cart, a forklift, a handtruck, a dolly, a cart, or the like. Item 208 may then arrive at packing zone 211.

Packing zone 211 may be an area of FC 200 where items are received from picking zone 209 and packed into boxes or bags for eventual shipping to customers. In packing zone 211, a worker assigned to receiving items (a "rebin worker") will receive item 208 from picking zone 209 and determine what order it corresponds to. For example, the rebin worker may use a device, such as computer 119C, to scan a barcode on item 208. Computer 119C may indicate visually which order item 208 is associated with. This may include, for example, a space or "cell" on a wall 216 that corresponds to an order. Once the order is complete (e.g., because the cell contains all items for the order), the rebin worker may indicate to a packing worker (or "packer") that the order is complete. The packer may retrieve the items from the cell and place them in a box or bag for shipping. The packer may then send the box or bag to a hub zone 213, e.g., via forklift, cart, dolly, handtruck, conveyor belt, manually, or otherwise.

Hub zone 213 may be an area of FC 200 that receives all boxes or bags ("packages") from packing zone 211. Workers and/or machines in hub zone 213 may retrieve package 218 and determine which portion of a delivery area each package is intended to go to, and route the package to an appropriate camp zone 215. For example, if the delivery area has two smaller sub-areas, packages will go to one of two camp zones 215. In some embodiments, a worker or machine may scan a package (e.g., using one of devices 119A-119C) to determine its eventual destination. Routing the package to camp zone 215 may comprise, for example, determining a portion of a geographical area that the package is destined for (e.g., based on a postal code) and determining a camp zone 215 associated with the portion of the geographical area.

Camp zone 215, in some embodiments, may comprise one or more buildings, one or more physical spaces, or one or more areas, where packages are received from hub zone 213 for sorting into routes and/or sub-routes. In some embodiments, camp zone 215 is physically separate from FC 200 while in other embodiments camp zone 215 may form a part of FC 200.

Workers and/or machines in camp zone 215 may determine which route and/or sub-route a package 220 should be associated with, for example, based on a comparison of the destination to an existing route and/or sub-route, a calculation of workload for each route and/or sub-route, the time of day, a shipping method, the cost to ship the package 220, a PDD associated with the items in package 220, or the like. In some embodiments, a worker or machine may scan a package (e.g., using one of devices 119A-119C) to determine its eventual destination. Once package 220 is assigned to a particular route and/or sub-route, a worker and/or machine may move package 220 to be shipped. In exemplary FIG. 2, camp zone 215 includes a truck 222, a car 226, and delivery workers 224A and 224B. In some embodiments, truck 222 may be driven by delivery worker 224A, where delivery worker 224A is a full-time employee that delivers packages for FC 200 and truck 222 is owned, leased, or operated by the same company that owns, leases, or operates FC 200. In some embodiments, car 226 may be driven by delivery worker 224B, where delivery worker 224B is a "flex" or occasional worker that is delivering on an as-needed basis (e.g., seasonally). Car 226 may be owned, leased, or operated by delivery worker 224B.

Figure 3:
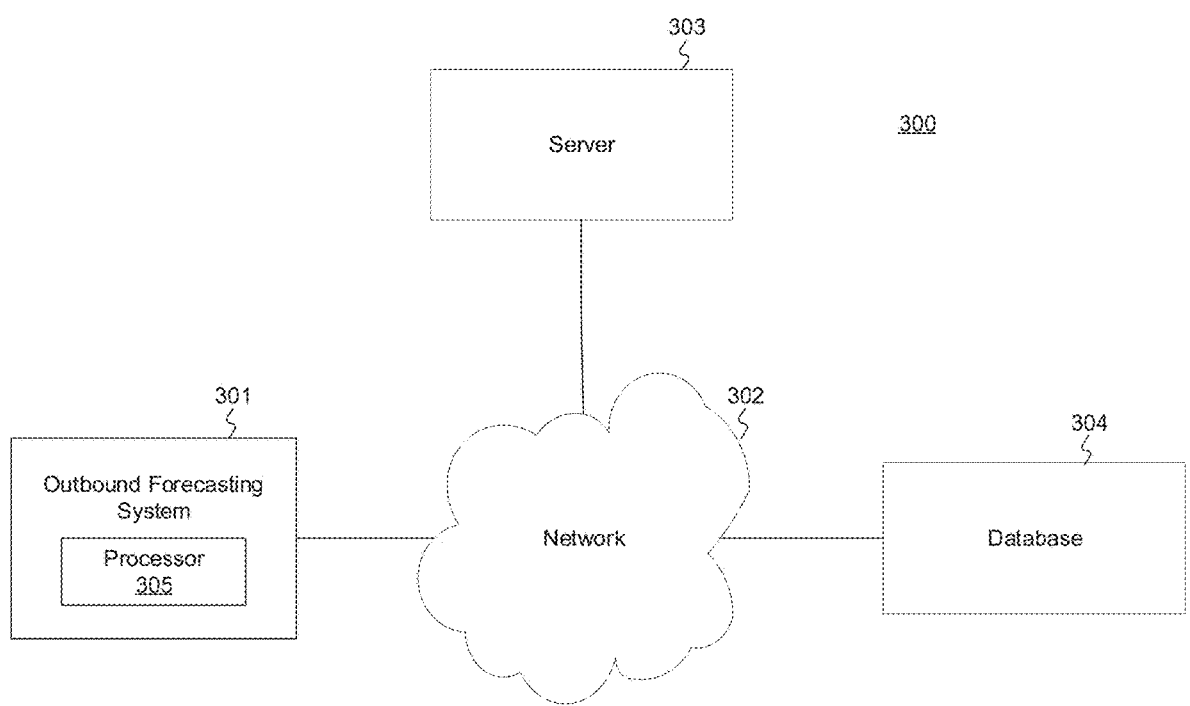
FIG. 3 is a schematic block diagram illustrating an exemplary embodiment of a system comprising an outbound forecasting system, consistent with the disclosed embodiments.

Referring to FIG. 3, a schematic block diagram 300 illustrating an exemplary embodiment of a system comprising an outbound forecasting system 301. Outbound forecasting system 301 may be associated with one or more systems in system 100 of FIG. 1A. For example, outbound forecasting system 301 may be implemented as part of SCM system 117. Outbound forecasting system 301, in some embodiments, may be implemented as a computer system that stores information for each FC 200 as well as information for customer orders from other systems (e.g., external front end system 103, shipment and order tracking system 111, and/or FO system 113). For example, outbound forecasting system 301 may include one or more processors 305, which may process information describing a distribution of SKUs among FCs and store the information in a database, such as database 304. One or more processors 305 of outbound forecasting system 301, thus, may process a list of SKUs that are stored in each FC and store the list in database 304. One or more processors 305 may also process information describing constraints associated with each of the FCs and store the information in database 304. For example, certain FCs may have constraints, including maximum capacity, compatibility with certain items due to size, refrigeration needs, weight, or other item requirements, costs of transfer, building restrictions, and/or any combination thereof. By way of example, certain items may be stored only in one fulfillment center, while certain other items may be stored in multiple fulfillment centers. In still other embodiments, certain fulfilment centers may be designed to store only a particular set of items (e.g., fresh produce or frozen products). One or more processors 305 may process or retrieve this information as well as associated information (e.g., quantity, size, date of receipt, expiration date, etc.) for each FC and store this information in database 304.

In some embodiments, one or more processors 305 of the outbound forecasting system 301 may also be configured to generate a FC priority filter, which may be used to allocate a plurality of SKUs among a plurality of FCs. By way of example, one or more processors 305 may be configured to receive an initial distribution of priority values to each FC in each region. The initial distribution of priority values may be randomly generated. One or more processors 305 may run a simulation, using a simulation algorithm, such as a genetic algorithm, of the initial distribution and calculate an outbound capacity utilization (OCU) value of each FC. One or more processors 305 may determine a number of FCs comprising an outbound capacity utilization value that exceeds a predetermined threshold and feed the simulation algorithm with at least one of the determined number of FCs to generate one or more additional distributions of priority values. One or more processors 305 may then generate a FC priority filter comprising an optimal set of priority values assigned to each FC based on the one or more additional distributions of priority values. In some embodiments, one or more processors 305 may also modify an allocation of a plurality of SKUs among a plurality of FCs based on the generated priority filter. The plurality of SKUs may be specific to each corresponding product, and thus, may be indicative of a manufacturer, material, color, packaging type, weight, or any other characteristic associated with each corresponding product.

In other embodiments, one or more processors 305 may store forecasted outbound of SKUs to FCs 200 in a database 304. In some embodiments, outbound forecasting system 301 may retrieve information from the database 304 over network 302. Database 304 may include one or more memory devices that store information and are accessed through network 302. By way of example, database 304 may include Oracle™ databases, Sybase™ databases, or other relational databases or non-relational databases, such as Hadoop sequence files, HBase, or Cassandra. While database 304 is illustrated as being included in the system 300, it may alternatively be located remotely from system 300. In other embodiments, database 304 may be incorporated into optimization system 301. Database 304 may include computing components (e.g., database management system, database server, etc.) configured to receive and process requests for data stored in memory devices of database 304 and to provide data from database 304.

System 300 may also comprise a network 302 and a server 303. Outbound forecasting system 301, server 303, and database 304 may be connected and be able to communicate with each other via network 302. Network 302 may be one or more of a wireless network, a wired network or any combination of wireless network and wired network. For example, network 302 may include one or more of a fiber optic network, a passive optical network, a cable network, an Internet network, a satellite network, a wireless LAN, a Global System for Mobile Communication ("GSM"), a Personal Communication Service ("PCS"), a Personal Area Network ("PAN"), D-AMPS, Wi-Fi, Fixed Wireless Data, IEEE 802.11b, 802.15.1, 802.11n and 802.11g or any other wired or wireless network for transmitting and receiving data.

In addition, network 302 may include, but not be limited to, telephone lines, fiber optics, IEEE Ethernet 902.3, a wide area network ("WAN"), a local area network ("LAN"), or a global network such as the Internet. Also network 302 may support an Internet network, a wireless communication network, a cellular network, or the like, or any combination thereof. Network 302 may further include one network, or any number of the exemplary types of networks mentioned above, operating as a stand-alone network or in cooperation with each other. Network 302 may utilize one or more protocols of one or more network elements to which they are communicatively coupled. Network 302 may translate to or from other protocols to one or more protocols of network devices. Although network 302 is depicted as a single network, it should be appreciated that according to one or more embodiments, network 302 may comprise a plurality of interconnected networks, such as, for example, the Internet, a service provider's network, a cable television network, corporate networks, and home networks.

Server 303 may be a web server. Server 303, for example, may include hardware (e.g., one or more computers) and/or software (e.g., one or more applications) that deliver web content that can be accessed by, for example a user through a network (e.g., network 302), such as the Internet. Server 303 may use, for example, a hypertext transfer protocol (HTTP or sHTTP) to communicate with a user. The web pages delivered to the user may include, for example, HTML documents, which may include images, style sheets, and scripts in addition to text content.

A user program such as, for example, a web browser, web crawler, or native mobile application, may initiate communication by making a request for a specific resource using HTTP and server 303 may respond with the content of that resource or an error message if unable to do so. Server 303 also may enable or facilitate receiving content from the user so the user may be able to, for example, submit web forms, including uploading of files. Server 303 may also support server-side scripting using, for example, Active Server Pages (ASP), PHP, or other scripting languages. Accordingly, the behavior of server 303 can be scripted in separate files, while the actual server software remains unchanged.

In other embodiments, server 303 may be an application server, which may include hardware and/or software that is dedicated to the efficient execution of procedures (e.g., programs, routines, scripts) for supporting its applied applications. Server 303 may comprise one or more application server frameworks, including, for example, Java application servers (e.g., Java platform, Enterprise Edition (Java EE), the .NET framework from Microsoft®, PHP application servers, and the like). The various application server frameworks may contain a comprehensive service layer model. Server 303 may act as a set of components accessible to, for example, an entity implementing system 100, through an API defined by the platform itself.

In some embodiments, as discussed above, one or more processors 305 of outbound forecasting system 301 may apply the FC priority filter and simulate outbound flow of products. In some embodiments, one or more processors 305 may optimize outbound flow through SKU mapping. SKU mapping is the allocation of SKUs to FCs, and outbound network optimization may be achieved through SKU mapping. One or more processors 305 may generate a simulation, via SKU mapping, and each simulation may comprise different allocation of SKUs among FCs, based on the FC priority filter. Each simulation may be randomly generated. Accordingly, one or more processors 305 may find an optimal simulation by generating one or more simulations and selecting the optimal simulation that improves most upon the output rate of one or more FCs across a statewide, regional, or nationwide network. Determining an optimal simulation that improves upon the output rate may be crucial in optimizing outbound flow of products. For example, while it may be easier to place one of each item in each FC, this may not be optimal because the FC will run out of items quickly if customer demand for a particular item increases rapidly. Likewise, if all of one item is placed in a single FC, this may not be optimal because customers from various locations may want the item. Then, because the item will only be available in a single FC, costs to transfer the item from one FC to another FC may increase, and thus, the system will lose efficiency. Accordingly, the computerized embodiments directed to optimizing outbound flow of products provide novel and crucial systems for determining an optimal distribution of SKUs among FCs.

In yet another embodiment, one or more processors 305 may be able to implement one or more constraints, such as business constraints, to genetic algorithms. Constraints may include, for example, maximum capacity of each FC, item compatibility associated with each FC, costs associated with FC, or any other characteristics associated with each FC. Maximum capacity of each FC may include information associated with how many SKUs can be held at each FC. Item compatibility associated with each FC may include information associated with certain items that cannot be held at certain FCs due to size of the items, weight of the items, need for refrigeration, or other requirements associated with the items/SKUs. There may also be building restrictions associated with each FC that allow certain items to be held and prevent certain items to be held at each FC. Costs associated with each FC may include FC-to-FC transfer costs, cross-cluster shipment costs (e.g., shipping costs incurred from shipping items from multiple FCs), shipping costs incurred from cross-stocking items between FCs, unit per parcel (UPP) costs associated with having all SKUs in one FC, or any combination thereof.

In other embodiments, one or more processors 305 may cache one or more portions of the genetic algorithm in order to increase efficiency. For example, one or more portions of the genetic algorithm may be cached to obviate the need to re-run all portions of the algorithm each time a simulation is generated. One or more processors 305 may determine which portion(s) of the genetic algorithm may be cached based on whether there will be significant changes in each iteration. For example, some parameters may remain consistent each time a simulation is generated, while other parameters may change. The parameters that remain consistent each time will not need to be re-run each time a simulation is generated. Therefore, one or more processors 305 may cache these consistent parameters. For example, maximum capacity at each FC may not change each time a simulation is generated, and thus, may be cached. On the other hand, parameters that may vary per simulation may include, for example, customer order profiles, customer interest in each SKU across regions, or stowing models. Customer order profiles may refer to behavior of customer orders across a statewide, regional, or nationwide network. For example, customer order profiles may refer to ordering patterns of customer orders across a statewide, regional, or nationwide network. Customer interest in each SKU may refer to the amount of customer demand for each item across a statewide, regional, or nationwide network. Stowing models may refer to models indicating where a particular item is placed, such as a particular spot in picking zone 209 or a particular space on a storage unit 210 in each FC. Stowing models may vary for each FC. By caching one or more portions of the genetic algorithm, one or more processors 305 may increase efficiency and reduce processing capacity.

In some embodiments, another constraint added to the simulation algorithm may comprise customer demand at each of the FCs. One or more processors 305 may be able to determine customer demand at each of the FCs by looking at order histories at each of the FCs. In other embodiments, one or more processors 305 may simulate customer demand at each of the FCs. For example, based on at least the order histories at each FC, one or more processors 305 may predict and/or simulate customer demand at each FC. Based on at least the simulated customer demand at each of the FCs, one or more processors 305 may modify an allocation of SKUs among the FCs in order to optimize SKU allocation, SKU mapping, and outbound flow of products.

FIG. 4 is an exemplary matrix 400 of a distribution of priority values ($P_{xr}$) assigned to each FC ($FC_x$) in each region ($R_r$), consistent with the embodiments of the present disclosure. Referring to matrix 400 of FIG. 4, for example, $FC_1$ in region $R_1$ may be assigned a priority value $P_{11}$, $FC_2$ in region $R_2$ may be assigned a priority value $P_{22}$, and so forth.

As discussed above, an initial matrix 400 may be a two-dimensional matrix that is randomly generated. That is, the priority values ($P_{xr}$) assigned to each FC ($FC_x$) in each region ($R_r$) may be randomly generated. One or more processors 305 may be configured to run a simulation of the initial matrix 400 using a simulation algorithm, such as a genetic algorithm. As such, one or more processors 305 may simulate outbound flow when each FC is assigned a corresponding priority value in the initial matrix 400. For example, one or more processors 305 may calculate an outbound capacity utilization value of each FC after running the simulation of the initial matrix 400. The outbound capacity utilization value may comprise a ratio of an outbound of each FC to an outbound capacity of the FC. Then, one or more processors 305 may determine a number of FCs comprising an outbound capacity utilization value that exceeds a predetermined threshold. The predetermined threshold may comprise a minimum outbound of each FC.

After determining the number of FCs having an outbound capacity utilization value of above the predetermined threshold, one or more processors 305 may feed the simulation algorithm with at least one of the determined number of FCs to generate one or more additional matrices of priority values. In generating one or more additional matrices, for example, one or more processors 305 may maintain the priority values assigned to at least one of the determined number of FCs having an outbound capacity utilization value of above the predetermined threshold, while varying the priority values assigned to FCs having an outbound capacity utilization value below the predetermined threshold. One or more processors 305 may generate one or more additional matrices until a termination requirement is met. For example, the termination requirement may be met when the number of FCs having an outbound capacity utilization value of above the predetermined threshold exceeds a second predetermined threshold. That is, one or more processors 305 may continue feeding the simulation algorithm to generate one or more additional matrices of priority values until a predetermined number of FCs have an outbound capacity utilization value exceeding the predetermined threshold. Once the number of FCs having an outbound capacity utilization value of above the predetermined threshold exceeds a second predetermined threshold, the matrix 400 of priority values may constitute a FC priority filter comprising an optimal set of priority values. One or more processors 305 may, then, use the FC priority filter generated based on the one or more additional matrices of priority values to modify an allocation of plurality of SKUs among a plurality of FCs.

Figure 5:
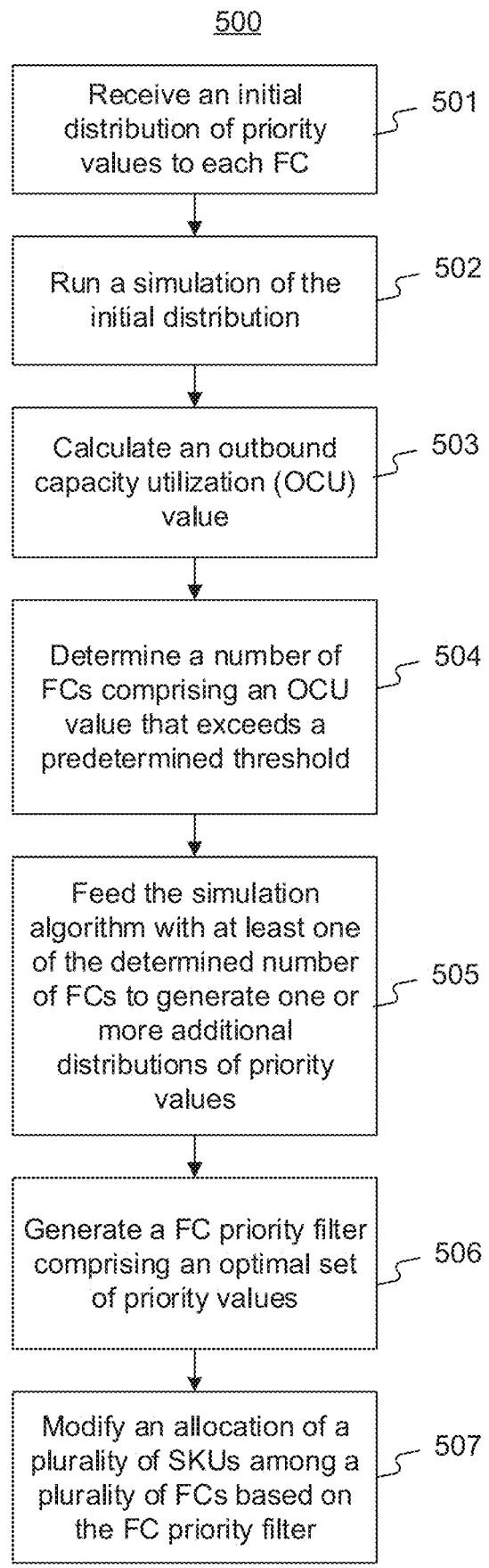
FIG. 5 is a flowchart illustrating an exemplary embodiment of a method for outbound forecasting, consistent with the disclosed embodiments.

FIG. 5 is a flow chart illustrating an exemplary method 500 for outbound forecasting. This exemplary method is provided by way of example. Method 500 shown in FIG. 5 can be executed or otherwise performed by one or more combinations of various systems. Method 500 as described below may be carried out by the outbound forecasting system 301, as shown in FIG. 3, by way of example, and various elements of that system are referenced in explaining the method of FIG. 5. Each block shown in FIG. 5 represents one or more processes, methods, or subroutines in the exemplary method 500. Referring to FIG. 5, exemplary method 500 may begin at block 501.

At block 501, one or more processors 305 may receive an initial distribution of priority values to each FC. The initial distribution of priority values may comprise a two-dimensional matrix of priority values, such as matrix 400 in FIG. 4. After receiving the initial distribution of priority values to each FC in each region, method 500 may proceed to block 502. At block 502, one or more processors 305 may run a simulation of the initial distribution. For example, one or more processors 305 may simulate the outbound flow of products based on the initial distribution of priority values to each FC. One or more processors 305 may run a simulation of each FC in each region in the initial distribution of priority values, in order to determine how well the initial distribution of priority values performs.

In order to determine how well the initial distribution of priority values performs, method 500 may proceed to block 503, at which one or more processors 305 may calculate an outbound capacity utilization (OCU) value. As discussed above, the OCU value may comprise a ratio of an outbound of each FC to an outbound capacity of the FC. After calculating the OCU value of each FC based on the initial distribution of priority values, method 500 may proceed to block 504. At block 504, one or more processors 305 may determine a number of FCs comprising an OCU value that exceeds a predetermined threshold. The predetermined threshold may comprise a minimum outbound of each FC.

After determining the number of FCs having an outbound capacity utilization value of above the predetermined threshold, method 500 may proceed to block 505. At block 505, one or more processors 305 may feed the simulation algorithm, such as a genetic algorithm, with at least one of the determined number of FCs to generate one or more additional matrices of priority values. In generating one or more additional matrices, for example, one or more processors 305 may maintain the priority values assigned to at least one of the determined number of FCs having an OCU value of above the predetermined threshold, while varying the priority values assigned to FCs having an OCU value below the predetermined threshold. One or more additional matrices may be generated until a termination requirement is met. For example, the termination requirement may be met when the number of FCs having an OCU value of above the predetermined threshold exceeds a second predetermined threshold. That is, one or more processors 305 may continue feeding the simulation algorithm to generate one or more additional matrices of priority values until a predetermined number of FCs have an OCU value exceeding the predetermined threshold.

Once the number of FCs having an OCU value of above the predetermined threshold exceeds a second predetermined threshold, method 500 may proceed to block 506. At block 506, one or more processors 305 may generate a FC priority filter based on the one or more additional distributions of priority values generated. The FC priority filter the matrix 400 of priority values may comprise an optimal set of priority values assigned to each FC, e.g., a set of priority values that will result in the number of FCs having an OCU value of above the predetermined threshold exceeding a second predetermined threshold.

After generating the FC priority filter, method 500 may proceed to block 507. At block 507, one or more processors 305 may, then, use the FC priority filter generated based on the one or more additional matrices of priority values to modify an allocation of a plurality of SKUs among a plurality of FCs. For example, as discussed below, the FC priority filter generated may be applied to, for example, a simulated customer order profile to allocate a plurality of SKUs among a plurality of FCs.

Additionally or alternatively, the simulation algorithm used to generate the FC priority filter may also take into consideration one or more constraints associated with each FC. For example, one or more processors 305 may apply one or more constraints (e.g., maximum capacity of each FC, item compatibility associated with each FC, costs associated with FC, or any other characteristics associated with each FC) when generating one or more additional distributions of priority values to each FC. As such, each distribution of priority values to each FC may be randomly generated while also taking into consideration various constraints related to each FC.

Figure 6:
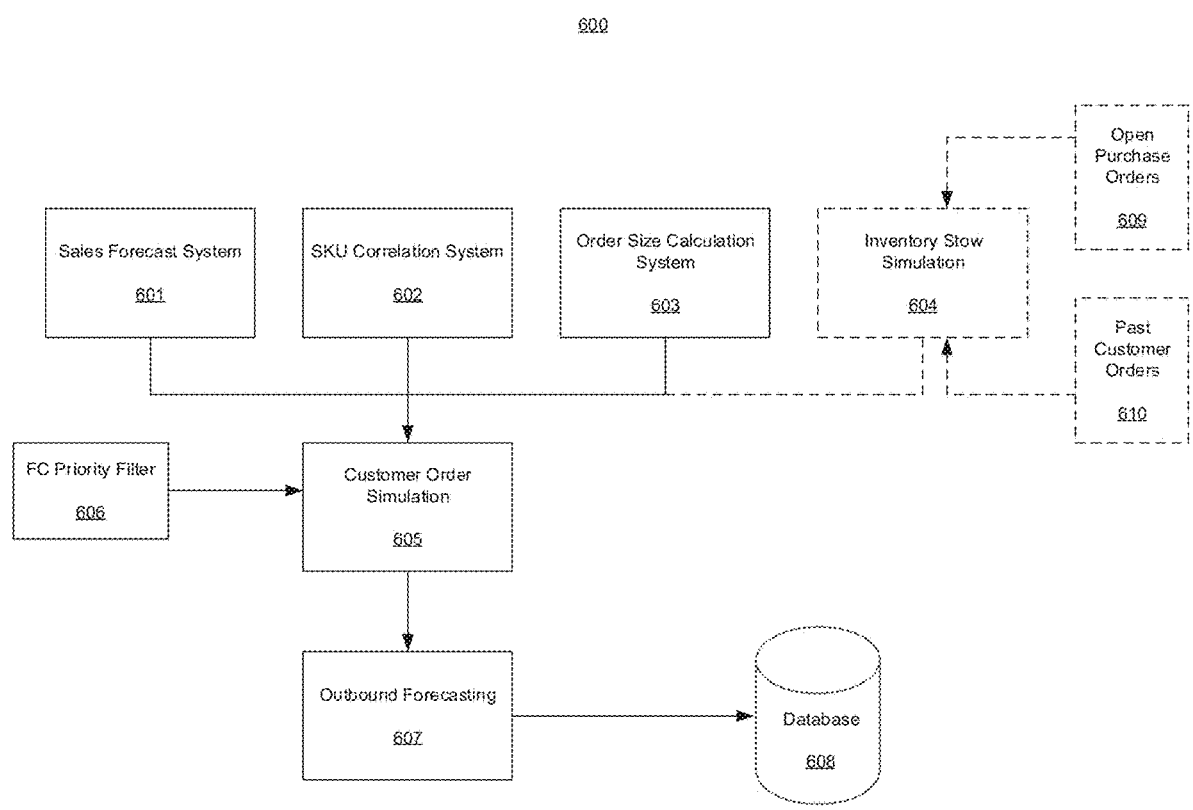
FIG. 6 is a schematic block diagram illustrating an exemplary embodiment of a system for outbound forecasting, consistent with the disclosed embodiments.

FIG. 6 is a schematic block diagram illustrating an exemplary embodiment of a system 600 for outbound forecasting. In some embodiments, system 600 may be implemented as part of SCM system 117. System 600 may comprise a sales forecast system 601, a SKU correlation system 602, an order size calculation system 603, and an outbound forecasting system 607. The outbound forecasting system 607 may be implemented as the outbound forecasting system 301 of FIG. 3. Additionally or alternatively, system 600 may also comprise an inventory stow simulation system 604.

The sales forecast system 601 may be an application running on a server, such as server 303. The sales forecast system 601 may be configured to predict a regional sales forecast. In some embodiments, the sales forecast system 601 may be configured to predict a regional sales forecast by calculating a sales forecast on a national level, e.g., national sales forecast, and calculating a regional ratio for each region. The regional ratio may be calculated based on data associated with past customer demand. Accordingly, the sales forecast system 601 may separate the national sales forecast into each region, thereby generating a prediction of a regional sales forecast for each region. The regional sales forecast, in some embodiments, may be indicative of a customer demand for each SKU in each region. For example, the regional sales forecast may be indicative of a quantity of each product sold in each region, based on past customer orders.

The SKU correlation system 602 may be configured to predict a correlation of one or more SKUs that will be combined in customer orders in each region. For example, the SKU correlation system 602 may be configured to calculate a possibility of one or more SKUs that may be consistently combined together in customer orders. As such, the SKU correlation system 602 may be configured to predict a correlation of one or more SKUs that are most likely to be combined together in customer orders in each region.

The order size calculation system 603 may be configured to predict a size of customer orders in each region. For example, the order size calculation system 603 may be configured to calculate how many different SKUs are likely to be in one customer order in each region. In some embodiments, the correlation predicted by the SKU correlation system 602 and the customer order size predicted by the order size calculation system 603 may be used to simulate a customer order 605.

The outbound forecasting system 607 may receive the regional sales forecast from the sales forecast system 601, the correlation predicted by the SKU correlation system 602, the customer order size predicted by the order size calculation system 603, and the customer order simulation 605. The outbound forecasting system 607 may, then, predict a FC, among a plurality of FCs, for storing each SKU based on the predicted regional sales forecast and the simulated customer order profile. For example, the outbound forecasting system 607 may determine an allocation of SKUs among the plurality of FCs that may optimize outbound flow of the network of FCs. The outbound forecasting system 607 may modify a database 608 to assign the predicted FC to each corresponding SKU. That is, the outbound forecasting system 607 may store the allocation of SKUs among the FCs in database 608.

In some embodiments, the outbound forecasting system 607 may apply a FC priority filter 606 to the simulated customer order profile 605. The FC priority filter may be the same as FC priority filter generated in step 506 of FIG. 5. As discussed above, the FC priority filter 606 may be generated, for example, by one or more processors of the outbound forecasting system 607. The FC priority filter 606 may be generated using a simulation algorithm, such as a genetic algorithm. For example, one or more processors of the outbound forecasting system 607 may randomly generate an initial distribution of priority values to each FC in each region. Then, one or more processors may run a simulation, using the simulation algorithm and/or the genetic algorithm, of the initial distribution of priority values. One or more processors may also calculate an outbound capacity utilization of each FC, based on the initial distribution of priority values. The outbound capacity utilization of each FC may comprise a ratio of an outbound of each FC to an outbound capacity of each FC. Then, one or more processors may determine a number of FCs comprising an outbound capacity utilization value that exceeds a minimum outbound value of each FC. One or more processors may feed the simulation algorithm with at least one of the determined number of FCs to generate one or more additional distributions of priority values in order to generate the FC priority filter 606. The FC priority filter 606 may comprise an optimal distribution of priority values to each FC that will maximize the number of FCs in the network having an outbound capacity utilization value that exceeds the minimum outbound value of each FC.

Using the FC priority filter 606, one or more processors of the outbound forecasting system 607 may perform a first-in-first-out (FIFO) setting, in which one or more processors assign an FC with the highest priority value first to a particular SKU and calculate an outbound capacity utilization value of each FC. Then, one or more processors may assign a next FC with the next highest priority value to the particular SKU and calculate an outbound capacity utilization value of each FC. One or more processors may repeat these steps until one or more processors determine an optimal allocation of SKUs among the FCs that will maximize the number of FCs in the network having an outbound capacity utilization value that exceeds the minimum outbound value of each FC. Based on the optimal allocation of SKUs among the FCs, one or more processors of the outbound forecasting system 607 may predict a FC for storing each SKU. In some embodiments, the predicted FC may be an FC, among the plurality of FCs that can be assigned to a particular SKU, with a highest priority value. In other embodiments, the predicted FC may be an FC, among a plurality of FCs that can be assigned to a particular SKU, that is capable of delivering a maximum number of the one or more SKUs combined in the simulated customer order profile. In some embodiments, the FC priority filter may vary based on each simulated customer order profile. For example, the FC priority filter may be adjusted based on the one or more SKUs in a simulated customer order profile.

In some embodiments, system 600 may comprise an inventory stow simulation system 604. The inventory stow simulation system 604 may be configured to simulate an inventory at each FC in each region based on at least one of open purchase orders 609 or past customer orders 610. Open purchase orders 609 may comprise unfulfilled customer orders, e.g., customer orders that have not been processed yet. In some embodiments, the outbound forecasting system 607 may also use the simulated inventory from the inventory stow simulation system 604 to predict the FC for storing each SKU.

In some embodiments, the one or more processors of the outbound forecasting system 607 may be configured to predict or simulate inventory at the predicted FC on a particular future date, e.g., x days from today. In order to predict or simulate inventory at the predicted FC on a particular future date, one or more processors may be configured to repeat the steps of receiving the prediction of the regional sales forecast, receiving the prediction of the correlation of one or more SKUs, receiving the prediction of the size of customer orders in each region, applying the FC priority filter to the simulated customer order profile, and predicting the FC for storing each SKU based on a number of days of outbound forecasting. For example, one or more processors may repeat the steps 3 times if predicting inventory at the predicted FC on a date 3 days from today. Similarly, one or more processors may repeat the steps 5 times if predicting inventory at the predicted FC on a date 5 days from today.

While the present disclosure has been shown and described with reference to particular embodiments thereof, it will be understood that the present disclosure can be practiced, without modification, in other environments. The foregoing description has been presented for purposes of illustration. It is not exhaustive and is not limited to the precise forms or embodiments disclosed. Modifications and adaptations will be apparent to those skilled in the art from consideration of the specification and practice of the disclosed embodiments. Additionally, although aspects of the disclosed embodiments are described as being stored in memory, one skilled in the art will appreciate that these aspects can also be stored on other types of computer readable media, such as secondary storage devices, for example, hard disks or CD ROM, or other forms of RAM or ROM, USB media, DVD, Blu-ray, or other optical drive media.

Computer programs based on the written description and disclosed methods are within the skill of an experienced developer. Various programs or program modules can be created using any of the techniques known to one skilled in the art or can be designed in connection with existing software. For example, program sections or program modules can be designed in or by means of .Net Framework, .Net Compact Framework (and related languages, such as Visual Basic, C, etc.), Java, C++, Objective-C, HTML, HTML/AJAX combinations, XML, or HTML with included Java applets.

Moreover, while illustrative embodiments have been described herein, the scope of any and all embodiments having equivalent elements, modifications, omissions, combinations (e.g., of aspects across various embodiments), adaptations and/or alterations as would be appreciated by those skilled in the art based on the present disclosure. The limitations in the claims are to be interpreted broadly based on the language employed in the claims and not limited to examples described in the present specification or during the prosecution of the application. The examples are to be construed as non-exclusive. Furthermore, the steps of the disclosed methods may be modified in any manner, including by reordering steps and/or inserting or deleting steps. It is intended, therefore, that the specification and examples be considered as illustrative only, with a true scope and spirit being indicated by the following claims and their full scope of equivalents.

What is claimed is:

1. A computer-implemented system for outbound forecasting, the system comprising:
   a memory storing instructions; and
   at least one processor configured to execute the instructions to:
   receive an initial distribution of priority values to each fulfillment center (FC) in each region;
   run a simulation, using a genetic algorithm, of the initial distribution;
   calculate an outbound capacity utilization value of each FC;
   determine a number of FCs comprising an outbound capacity utilization value that exceeds a first predetermined threshold;
   feed the genetic algorithm with at least one of the determined number of FCs to generate one or more additional distributions of priority values;
   generate a FC priority filter based on the one or more additional distributions of priority values;
   wherein the generated FC priority filter comprises an optimal matrix of priority values such that the number of FCs, having the outbound capacity utilization value greater than the first predetermined threshold, exceeds a second predetermined threshold,
   simulate customer demand at each of the plurality of FCs; and
   wherein products associated with the plurality of SKUs are stowed in corresponding FCs based on the allocation for shipping to customers,
   modify an allocation of a plurality of SKUs among a plurality of FCs based on the generated FC priority filter and the simulated customer demand,
   wherein the at least one processor is further configured to execute the instructions to cache at least a portion of the simulation algorithm, and wherein the cached portion of the simulation algorithm comprises at least one constraint that remains substantially constant with each run of the simulation algorithm.

2. The system of claim 1, wherein the predetermined threshold comprises a minimum outbound of each FC.

3. The system of claim 1, wherein the outbound capacity utilization value of each FC comprises a ratio of an outbound of each FC to an outbound capacity of each FC.

4. The system of claim 1, wherein each of the initial distribution and the one or more additional distributions comprises a two-dimensional matrix of priority values.

5. The system of claim 1, wherein the initial distribution of priority values to each FC in each region is randomly generated.

6. The system of claim 1, wherein the simulation algorithm comprises at least one constraint, the constraint comprising at least one of customer demand at each of the FCs, maximum capacities of the FCs, compatibility with FCs, or transfer costs between FCs.

7. The system of claim 1, wherein each of the plurality of SKUs is indicative of at least one of a manufacturer, material, size, color, packaging, type, or weight of a product.

8. A computer-implemented method for outbound forecasting, the method comprising:
    receiving an initial distribution of priority values to each fulfillment center (FC) in each region;
    running a simulation, using a genetic algorithm, of the initial distribution;
    calculating an outbound capacity utilization value of each FC;
    determining a number of FCs comprising an outbound capacity utilization value that exceeds a predetermined threshold;
    feeding the genetic algorithm with the determined number of FCs to generate one or more additional distributions of priority values;
    generating a FC priority filter based on the one or more additional distributions of priority values;
    wherein the generated FC priority filter comprises an optimal matrix of priority values such that the number of FCs having the outbound capacity utilization value greater than the first predetermined threshold exceeds a second predetermined threshold,
    simulating customer demand at each of the plurality of FCs; and
    wherein products associated with the plurality of SKUs are stowed in corresponding FCs based on the allocation for shipping to customers,
    modifying an allocation of a plurality of SKUs among a plurality of FCs based on the generated FC priority filter and the simulated customer demand,
    wherein the method further comprises caching at least a portion of the simulation algorithm, and
    wherein the cached portion of the simulation algorithm comprises at least one constraint that remains substantially constant with each run of the simulation algorithm.

9. The method of claim 8, wherein the predetermined threshold comprises a minimum outbound of each FC.

10. The method of claim 8, wherein the outbound capacity utilization value of each FC comprises a ratio of an outbound of each FC to an outbound capacity of each FC.

11. The method of claim 8, wherein each of the initial distribution and the one or more additional distributions comprises a two-dimensional matrix of priority values.

12. The method of claim 8, wherein the initial distribution of priority values to each FC in each region is randomly generated.

13. The method of claim 8, wherein the simulation algorithm comprises at least one constraint, the constraint comprising at least one of customer demand at each of the FCs, maximum capacities of the FCs, compatibility with FCs, or transfer costs between FCs.

14. A computer-implemented system for outbound forecasting, the system comprising:
    a memory storing instructions; and
    at least one processor configured to execute the instructions to:
    receive an initial matrix of priority values to each fulfillment center (FC) in each region, wherein the initial matrix is randomly generated;
    run a simulation, using a genetic algorithm, of the initial matrix;
    calculate an outbound capacity utilization value of each FC, wherein the outbound capacity utilization value of each FC comprises a ratio of an outbound of each FC to an outbound capacity of each FC;
    determine a number of FCs comprising an outbound capacity utilization value that exceeds a predetermined threshold;
    feed the genetic algorithm with the determined number of FCs to generate one or more additional matrices of priority values;
    generate a FC priority filter based on the one or more additional matrices of priority values;
    wherein the generated FC priority filter comprises an optimal matrix of priority values such that the number of FCs having the outbound capacity utilization value greater than the first predetermined threshold, exceeds a second predetermined threshold,
    simulate customer demand at each of the plurality of FCs; and
    wherein products associated with the plurality of SKUs are stowed in corresponding FCs based on the allocation for shipping to customers,
    modify an allocation of a plurality of SKUs among a plurality of FCs based on the generated FC priority filter and the simulated customer demand,
    wherein the at least one processor is further configured to execute the instructions to cache at least a portion of the simulation algorithm, and
    wherein the cached portion of the simulation algorithm comprises at least one constraint that remains substantially constant with each run of the simulation algorithm.

* * * * *